US009647186B2

(12) United States Patent
Schmid et al.

(10) Patent No.: US 9,647,186 B2
(45) Date of Patent: May 9, 2017

(54) METHOD FOR PRODUCING AN ELECTRONIC COMPONENT AND ELECTRONIC COMPONENT

(71) Applicants: Christian Schmid, Regensburg (DE); Tilman Schlenker, Nittendorf (DE); Heribert Zull, Regensburg (DE); Ralph Paetzold, Roth (DE); Markus Klein, Tegerneheim (DE); Karsten Heuser, Erlangen (DE)

(72) Inventors: Christian Schmid, Regensburg (DE); Tilman Schlenker, Nittendorf (DE); Heribert Zull, Regensburg (DE); Ralph Paetzold, Roth (DE); Markus Klein, Tegerneheim (DE); Karsten Heuser, Erlangen (DE)

(73) Assignee: OSRAM OLED GmbH, Regensburg (DE)

( * ) Notice: Subject to any disclaimer, the term of this patent is extended or adjusted under 35 U.S.C. 154(b) by 223 days.

(21) Appl. No.: 14/163,240

(22) Filed: Jan. 24, 2014

(65) Prior Publication Data
US 2014/0141549 A1 May 22, 2014

Related U.S. Application Data

(63) Continuation of application No. 12/865,358, filed as application No. PCT/DE2009/000133 on Jan. 29, 2009, now Pat. No. 8,658,442.

(30) Foreign Application Priority Data

Jan. 30, 2008 (DE) .......................... 10 2008 006 721
Apr. 21, 2008 (DE) .......................... 10 2008 019 900
(Continued)

(51) Int. Cl.
 *H01L 21/00* (2006.01)
 *H01L 33/62* (2010.01)
 (Continued)

(52) U.S. Cl.
 CPC ............ *H01L 33/62* (2013.01); *H01L 33/486* (2013.01); *H01L 33/54* (2013.01); *H01L 2924/01078* (2013.01); *H01L 2924/01079* (2013.01)

(58) Field of Classification Search
 CPC ....... H01L 33/62; H01L 33/486; H01L 33/54; H01L 2924/01079; H01L 2924/01078
 (Continued)

(56) References Cited

U.S. PATENT DOCUMENTS

| 4,177,473 A | 12/1979 | Ovshinsky |
| 4,609,771 A | 9/1986 | Guha et al. |

(Continued)

FOREIGN PATENT DOCUMENTS

| CN | 1899815 | 1/2007 |
| DE | 102004 041497 | 3/2006 |

(Continued)

OTHER PUBLICATIONS

Giron et al., "Quantitation of Amorphicity by Microcalorimetry", Journal of Thermal Analysis, vol. 48 (1997) 465-472.
(Continued)

*Primary Examiner* — Anthony Ho
(74) *Attorney, Agent, or Firm* — Cozen O'Connor (57) ABSTRACT

A method for producing an electronic component comprising barrier layers for the encapsulation of the component comprises, in particular, the following steps: providing a substrate with at least one functional layer, applying at least one first barrier layer on the functional layer via plasma enhanced atomic layer deposition (PEALD), and applying at
(Continued)

least one second barrier layer on the functional layer by means of plasma-enhanced chemical vapor deposition (PECVD), where the at least one first barrier layer is applied at a temperature of less than 100° C.

15 Claims, 3 Drawing Sheets

(30) Foreign Application Priority Data

Jul. 2, 2008 (DE) .................. 10 2008 031 405
Sep. 23, 2008 (DE) .................. 10 2008 048 472

(51) Int. Cl.
H01L 33/48 (2010.01)
H01L 33/54 (2010.01)

(58) Field of Classification Search
USPC ............................................. 438/26
See application file for complete search history.

(56) References Cited

U.S. PATENT DOCUMENTS

| | | | |
|---|---|---|---|
| 5,208,467 A | 5/1993 | Yamazaki | |
| 5,296,716 A | 3/1994 | Ovshinsky et al. | |
| 5,792,550 A | 8/1998 | Phillips et al. | |
| 6,538,374 B2 | 3/2003 | Hosokawa | |
| 6,576,053 B1 | 6/2003 | Kim et al. | |
| 6,933,002 B2 | 8/2005 | Tera et al. | |
| 7,071,506 B2 | 7/2006 | Moon et al. | |
| 7,265,807 B2 | 9/2007 | Lifka et al. | |
| 7,291,890 B2 | 11/2007 | Visokay et al. | |
| 7,982,309 B2 | 7/2011 | Vervoort et al. | |
| 2001/0001504 A1 | 5/2001 | Sugiyama et al. | |
| 2001/0031379 A1 | 10/2001 | Tera et al. | |
| 2001/0052752 A1 | 12/2001 | Ghosh et al. | |
| 2002/0003403 A1 | 1/2002 | Ghosh et al. | |
| 2003/0036620 A1 | 2/2003 | Kawanabe et al. | |
| 2003/0085654 A1 | 5/2003 | Hayashi | |
| 2003/0129298 A1 | 7/2003 | Tera et al. | |
| 2003/0143319 A1 | 7/2003 | Park et al. | |
| 2003/0214232 A1 | 11/2003 | Guenther et al. | |
| 2003/0215970 A1 | 11/2003 | Yang et al. | |
| 2004/0201027 A1 | 10/2004 | Ghosh | |
| 2005/0041193 A1 | 2/2005 | Lifka et al. | |
| 2005/0181535 A1 | 8/2005 | Yun et al. | |
| 2005/0248270 A1 | 11/2005 | Ghosh et al. | |
| 2006/0040495 A1 | 2/2006 | Park et al. | |
| 2006/0109397 A1 | 5/2006 | Anandan | |
| 2006/0211224 A1 | 9/2006 | Matsuda | |
| 2006/0246811 A1 | 11/2006 | Winters et al. | |
| 2006/0250084 A1 | 11/2006 | Cok et al. | |
| 2006/0278965 A1 | 12/2006 | Foust et al. | |
| 2007/0020451 A1 | 1/2007 | Padiyath et al. | |
| 2007/0026243 A1 | 2/2007 | Iwanaga et al. | |
| 2007/0086174 A1 | 4/2007 | Minamio | |
| 2007/0159568 A1 | 7/2007 | Ono et al. | |
| 2007/0212484 A1 | 9/2007 | Li | |
| 2007/0273280 A1 | 11/2007 | Kim et al. | |
| 2007/0281174 A1 | 12/2007 | Moro et al. | |
| 2007/0295388 A1 | 12/2007 | Adriani et al. | |
| 2007/0295390 A1 | 12/2007 | Sheats et al. | |
| 2008/0018244 A1 | 1/2008 | Anandan | |
| 2008/0196664 A1 | 8/2008 | David et al. | |
| 2009/0324971 A1 | 12/2009 | De Vries et al. | |
| 2010/0108524 A1 | 5/2010 | van Mol et al. | |
| 2010/0132762 A1 | 6/2010 | Graham, Jr. et al. | |
| 2010/0157585 A1 | 6/2010 | Diekmann et al. | |
| 2011/0100458 A1 | 5/2011 | Kang et al. | |
| 2012/0187439 A1 | 7/2012 | Bösch et al. | |

FOREIGN PATENT DOCUMENTS

| | | |
|---|---|---|
| EP | 2857443 | 4/2015 |
| JP | 07-282975 | 10/1995 |
| JP | 2000-058777 | 2/2000 |
| JP | 2000-173768 | 6/2000 |
| JP | 2000-311518 | 11/2000 |
| JP | 2001-176653 | 6/2001 |
| JP | 2001-192238 | 7/2001 |
| JP | 2001-284042 | 10/2001 |
| JP | 2001-324725 | 11/2001 |
| JP | 2001-338755 | 12/2001 |
| JP | 2002-175877 | 6/2002 |
| JP | 2003-142255 | 5/2003 |
| JP | 2003-168556 | 6/2003 |
| JP | 2003-292615 | 10/2003 |
| JP | 2003-347042 | 12/2003 |
| JP | 2004-022281 | 1/2004 |
| JP | 2005-512299 | 4/2005 |
| JP | 2005-119148 | 5/2005 |
| JP | 2005-524946 | 8/2005 |
| JP | 2006-030681 | 2/2006 |
| JP | 2006-085920 | 3/2006 |
| JP | 2006-156985 | 6/2006 |
| JP | 2006-164543 | 6/2006 |
| JP | 2006-286220 | 10/2006 |
| JP | 2006-286242 | 10/2006 |
| JP | 2006-344423 | 12/2006 |
| JP | 2007-090803 | 4/2007 |
| JP | 2007/194212 | 8/2007 |
| JP | 2007-194212 | 8/2007 |
| JP | 2007-270352 | 10/2007 |
| JP | 2008-546211 | 12/2007 |
| JP | 2009-514177 | 4/2009 |
| JP | 2009-540128 | 11/2009 |
| JP | 2010-041067 | 2/2010 |
| KR | 10 2003-0089267 | 11/2003 |
| KR | 10-2005-0021152 | 3/2005 |
| KR | 10-2005-0078252 | 8/2005 |
| KR | 10-2006-0016864 | 2/2006 |
| TW | 345727 | 11/1998 |
| TW | 469546 | 12/2001 |
| TW | 572925 | 1/2004 |
| TW | 200642517 | 12/2006 |
| WO | WO 03/050894 | 6/2003 |
| WO | WO 03/096440 | 11/2003 |
| WO | WO 2006-101856 | 9/2006 |
| WO | WO 2006/134812 | 12/2006 |
| WO | WO 2006/135474 | 12/2006 |
| WO | WO 2007/051301 | 5/2007 |
| WO | WO 2007/145513 | 12/2007 |
| WO | 2008-538127 | 10/2008 |
| WO | WO 2009/094997 | 8/2009 |

OTHER PUBLICATIONS

Perkin Elmer, "Life and Analytical Sciences; Quantitation of the Amorphicity of the Lactose Using Material Pockets", Perkin Emer, Inc., 2007.

Sang-Hee Ko Park et al., "Ultra Thin Film Encapsulation of Organic Light Emitting Diode on a Plastic Substrate", ETRI Journal, vol. 27, No. 5, pp. 545-550, Oct. 2005.

Woong-Sun Kim et al., "Deposition of $Al_2O_3$ by Using ECR-ALD for Organic Substrate Devices", Journal of the Korean Physical Society, vol. 55, No. 1, pp. 55-58 (2009).

H. Lifka et al., "Thin Film Encapsulation of OLED Displays with a Nonon Stack", 2004 SID International Symposium Digest of Technical Papers, vol. 35, No. 2., pp. 1384-1387, May 26, 2004.

E. Langereis et al., "Plasma-assisted atomic layer deposition of $Al_2O_3$ moisture permeation barriers on polymers", Applied Physics Letters, vol. 89, No. 8, pp. 81915-081915, 2006.

Sun Jin Yun et al., "Passivation of organic light-emitting diodes with aluminum oxide thin films grown by plasma-enhanced atomic layer deposition", Applied Physics Letters, vol. 85, No. 21, pp. 4896-4898, Jan. 1, 2004.

(56) References Cited

OTHER PUBLICATIONS

W. Potscavage et al., "Encapsulation of pentacene/C60 organic solar cells with $Al_2O_3$ deposited by atomic layer deposition", Applied Physics Letters, vol. 90, No. 25, pp. 253511-253511, Jun. 21, 2007.
P. K. Sang-Hee et al., "Ultrathin Film Encapsulation of an OLED by ALD", Electrochemical and Solid-State Letters, vol. 8, No. 2, pp. H21-H23, Jan. 6, 2005.
Office Action dated Mar. 18, 2016 which issued in the co-pending U.S. Appl. No. 14/150,291.
Office Action dated Sep. 22, 2016 which issued in the co-pending U.S. Appl. No. 14/150,291.
Office Action dated Oct. 3, 2016 which issued in the corresponding Japanese Patent Application No. 2015-000300.

METHOD FOR PRODUCING AN ELECTRONIC COMPONENT AND ELECTRONIC COMPONENT

REFERENCE TO RELATED APPLICATIONS

This is a continuation application of U.S. application Ser. No. 12/865,358 filed Nov. 29, 2010, which is a U.S. national stage of application No. PCT/DE2009/000133 filed 29 Jan. 2009, and claims the priorities of German patent application 10 2008 006 721.0 filed Jan. 30, 2008, of German patent application 10 2008 019 900.1 filed Apr. 21, 2008, of German patent application 10 2008 031 405.6 filed Jul. 2, 2008, and of German patent application 10 2008 048 472.5 filed Sep. 23, 2008, the contents of which are incorporated by reference herein in their entirety.

FIELD OF THE INVENTION

A method for producing an electronic component and an electronic component are specified.

BACKGROUND OF THE INVENTION

For long-lasting operation of electronic components such as, for instance, inorganic light emitting diodes (LEDs) or organic light emitting diodes (OLEDs), it is often necessary to protect them against moisture. In particular, it can be necessary for the components to be subjected to comprehensive lifetime tests in order to ensure that they can maintain their functionality in everyday use for years.

SUMMARY OF THE INVENTION

Therefore, one object of at least one embodiment is to specify a method for producing an electronic component with an encapsulation. Furthermore, one object of at least one embodiment is to specify an electronic component with an encapsulation.

These and other objects are attained in accordance with one aspect of the present invention directed to a method for producing an electronic component comprising barrier layers for the encapsulation of the component in accordance with one embodiment comprises, in particular, the following steps:
  providing a substrate with at least one functional layer,
  applying at least one first barrier layer on the functional layer by means of plasma-enhanced atomic layer deposition (PEALD), and
  applying at least one second barrier layer on the functional layer by means of plasma-enhanced chemical vapor deposition (PECVD).

In this case, the fact that a first layer or a first element is arranged or applied "on" or "above" a second layer or a second element or else "between" two further layers or elements can mean here and hereinafter that the first layer or the first element is arranged directly in direct mechanical and/or electrical contact on the second layer or the second element or with the two further layers or elements. Furthermore, an indirect contact can also be designated, in the case of which further layers and/or elements are arranged between the first layer or the first element and the second layer or the second element or the two further layers or elements.

In this case, chemical vapor deposition (CVD) can denote a method in which, on at least one surface of the provided substrate with the at least one functional layer, at least two gaseous starting compounds react to form a solid reaction product. In this case, the at least two gaseous starting compounds can be fed simultaneously to a volume in which the substrate is provided. Furthermore, it can be necessary for the at least one surface of the provided substrate with the at least one functional layer to be heated to a temperature above room temperature.

Plasma-enhanced chemical vapor deposition (PECVD) can denote a CVD method in which a plasma is produced in the volume, as a result of which the at least two gaseous starting compounds fed to the volume can be excited in the plasma. As a result, it can be possible that the temperature to which the at least one surface has to be heated can be lowered in comparison with a plasmaless CVD method. It can be advantageous, in particular, since the at least one functional layer can be irreversibly damaged at a temperature above a maximum temperature. The maximum temperature can be approximately 120° C., for example, such that the temperature at which the second barrier layer is applied can be less than 120° C., and preferably less than or equal to 80° C.

Atomic layer deposition (ALD) can denote a method in which, in comparison with a CVD method, firstly a first of the at least two gaseous starting compounds is fed to the volume in which the substrate is provided, and can adsorb on the at least one surface. After preferably complete or almost complete covering of the at least one surface with the first starting compound, that portion of the first starting compound which is present such that it is still gaseous and/or has not adsorbed on the surface can be removed again from the volume and the second of the at least two starting compounds can be fed. The second starting compound can react with the first starting compound that has adsorbed at the at least one surface, with the formation of a solid layer. As in the case of a CVD method, it can be advantageous if the at least one surface is heated to a temperature above room temperature.

Plasma-enhanced atomic layer deposition (PEALD) can denote an ALD method in which the second starting compound is fed with a plasma being simultaneously produced, as a result of which, as in the case of PECVD methods, it can be possible for the second starting compound to be excited. As a result, the temperature to which the at least one surface is heated can be reduced in comparison with a plasmaless ALD method. In this case, by way of example, the first barrier layer can be applied at a temperature of less than 120° C. and preferably less than or equal to 80° C. In order to produce a further solid layer, the steps of feeding the first starting compound and then feeding the second starting compound can be repeated.

The encapsulation producible in the context of the method described here can have, in comparison with known encapsulations with barrier layers which are all produced by CVD methods, a lower permeability to moisture and/or oxygen. In the case of encapsulations with barrier layers which are all produced by CVD methods, it can be possible that channels, pores and/or grain boundaries occur which can lead to instances of lack of impermeability of the conventional encapsulations. Such instances of lack of impermeability can be fostered, in particular, by the fact that, in the case of electronic components, the maximum temperature at which barrier layers can be applied, as mentioned above, must not exceed approximately 120° C., and preferably approximately 80° C. As a result, conventional encapsulations with CVD-applied barrier layers require very complex and hence cost-intensive multilayer systems which can prevent economic production of electronic components with an encapsulation.

These disadvantages of conventional encapsulations can be avoided by means of the method described here. By means of the PEALD method for applying the first barrier layer, the first barrier layer, in comparison with a barrier layer applied by means of a CVD or PECVD method, can be produced with a higher density and the formation and/or continuation of channels and/or pores can be reduced or prevented in this case. Thus, a higher impermeability with regard to moisture and/or oxygen can also be achieved for the first barrier layer in comparison with a layer produced by means of a CVD method. In this case, it can be possible that the number of barrier layers and/or their thickness can be reduced in comparison with barrier layers of encapsulations which are produced by conventional CVD methods. As a result, it is possible to produce a thin encapsulation with at the same time high intrinsic impermeability onto small areas and also in large-area fashion and the diffusion of moisture and/or oxygen through grain boundaries, channels and/or pores can be reduced or prevented. Furthermore, the encapsulation with the first and second barrier layers as described here can also have a high impermeability in edge regions of the encapsulation, such that diffusion of moisture and/or oxygen through interfaces between the encapsulation and the provided substrate with the at least one functional layer can be reduced or prevented.

In comparison with furthermore known encapsulations by means of a covering glass wherein a getter material is additionally introduced into a cavity, the encapsulation with the first and second barrier layers as described here enables a more cost-effective production and a smaller thickness of the encapsulation. Furthermore, with the method described here, it can be possible to produce an electronic component with a transparent encapsulation, which is not possible in the case of the encapsulation by means of covering glass and getter material.

The method steps of applying the first barrier layer and the second barrier layer can be carried out directly successively in the same volume, for example in a conventional coating installation.

The first barrier layer can be applied by means of the PEALD method for example with a thickness of greater than or equal to 10 nm and less than or equal to 30 nm. That can mean that by means of the PEALD method, the first barrier layer can be produced with greater than or equal to 10 monolayers and less than or equal to 50 monolayers. By virtue of the high density and quality of the first barrier layer, such a thickness can be sufficient to ensure an effective protection against moisture and/or oxygen for the at least one functional layer situated underneath. Although the PEALD method can have a lower growth rate in comparison with the PECVD method, a short process time and thus a high economic viability of the method described here can be ensured on account of the small thickness of the first barrier layer.

On account of the high impermeability of the first barrier layer, the requirements made of the second barrier layer with regard to impermeability can be made less stringent than in the case of a conventional encapsulation with barrier layers which are all applied by CVD methods. In particular, the second barrier layer can be applied with a higher growth rate than the first barrier layer and have, after application, a thickness of greater than or equal to 1 nm and less than or equal to 1000 nm. In particular, the first barrier layer can be applied with a thickness of greater than or equal to 10 nm, preferably greater than or equal to 20 nm, and particularly preferably greater than or equal to 100 nm.

The method can have a further method step, wherein a protective layer is applied on the first and second barrier layers. In this case, the protective layer can be applied directly on the first or second barrier layer and thus be in direct contact with the first or the second barrier layer after application. In particular, the protective layer can enable a mechanical protection of the first and second barrier layers situated underneath. For this purpose, the protective layer can be applied with a thickness of greater than or equal to 1 μm and less than or equal to 100 μm. In particular, the protective layer can be applied with a thickness of greater than or equal to 5 μm, and preferably with a thickness of greater than or equal to 10 μm.

In this case, the protective layer can comprise, for instance, plastics such as, for instance, siloxanes, epoxides, acrylates such as, for example, methyl methacrylates, imides, carbonates, olefins, styrenes, urethanes or derivatives thereof in the form of monomers, oligomers or polymers and furthermore also mixtures, copolymers or compounds therewith. By way of example, the protective layer can comprise or be an epoxy resin, polymethyl methacrylate (PMMA), polystyrene, polycarbonate, polyacrylate, polyurethane or a silicone resin such as, for instance, polysiloxane or mixtures thereof. In this case, the protective layer can be transparent, for example.

The protective layer can furthermore have a spray coating or be embodied as a spray coating which comprises at least one of the abovementioned materials and which can be applied by means of a continuous spray coating installation, for example. The spray coating can furthermore be a UV-curable and/or a binder- or solvent-containing spray coating.

The electronic component producible by the method described here can be embodied as a radiation-emitting and/or radiation-receiving component and in this case as an organic or inorganic electronic component, for instance as an inorganic light emitting diode (LED), organic light emitting diode (OLED), inorganic photodiode (PD), organic photodiode (OPD), inorganic solar cell (SC), organic solar cell (OSC), inorganic transistor, in particular inorganic thin film transistor (TFT), organic transistor, in particular organic thin film transistor (OTFT), or as an integrated circuit (IC). Furthermore, the electronic component producible by the method described here can have a plurality or combination of the elements mentioned or be embodied in this way.

The electronic component can furthermore have, after production, a functional layer sequence comprising at least one first and one second electrode, between which the at least one functional layer comprising one or a plurality of inorganic and/or organic functional layers is arranged. In particular, the functional layer sequence can be arranged on a substrate.

If the component has, for example, an LED, an OLED, a PD, an OPD, an SC and/or an OSC, the functional layer sequence can have an active region suitable for generating or detecting electromagnetic radiation during the operation of the electronic component.

In one particularly preferred embodiment, in the method described here, the electronic component is produced as an organic electronic component comprising an organic radiation-emitting component having a radiation-emitting layer sequence. In this case, the radiation-emitting layer sequence can comprise the functional layer embodied as an organic functional layer. In particular, the electronic component can in this case comprise or be embodied as an organic radiation-emitting diode (OLED). For this purpose, the electronic component can have an active region suitable for emitting electromagnetic radiation during the operation of the electronic component by means of recombination of electrons and holes.

An organic radiation-emitting layer sequence or an OLED can have, for example, a first electrode on the substrate. The at least one organic functional layer or a plurality of functional layers composed of organic materials can be applied above the first electrode. In this case, the at least one organic functional layer or the plurality of functional layers can have or be embodied as, for example, electron transport layers, electroluminescent layers and/or hole transport layers. A second electrode can be applied above the organic functional layer or the plurality of organic functional layers.

By way of example, the substrate can comprise glass, quartz, plastic films, metal, metal films, silicon wafers or some other suitable substrate material. If the OLED is embodied as a so-called "bottom emitter", that is to say that the radiation generated in the active region is emitted through the substrate, then the substrate can have transparency to at least part of the first radiation.

In the bottom emitter configuration, the first electrode can advantageously also have transparency to at least part of the primary radiation. A transparent first electrode, which can be embodied as an anode and therefore serves as hole-injecting material, can, for example, comprise a transparent conductive oxide or consist of a transparent conductive oxide. Transparent conductive oxides ("TCO" for short) are transparent, conductive materials, generally metal oxides, such as, for example, zinc oxide, tin oxide, cadmium oxide, titanium oxide, indium oxide or indium tin oxide (ITO). Alongside binary metal-oxygen compounds such as, for example, $ZnO$, $SnO_2$ or $In_2O_3$, ternary metal-oxygen compounds such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs. Furthermore, the TCOs do not necessarily correspond to a stoichiometric composition and can also be p- or n-doped.

The organic functional layer or the plurality of functional layers can comprise organic polymers, organic oligomers, organic monomers, organic small, non-polymeric molecules ("small molecules") or combinations thereof. In particular, it can be advantageous if the organic radiation-emitting layer sequence has a functional layer embodied as a hole transport layer, in order to enable effective hole injection into an electroluminescent layer or an electroluminescent region. By way of example, tertiary amines, carbazole derivates, conductive polyaniline or polyethylene dioxythiophene can prove to be advantageous as materials for a hole transport layer. Furthermore, it can be advantageous if a functional layer is embodied as an electroluminescent layer. Suitable materials for this purpose include materials which exhibit radiation emission on account of fluorescence or phosphorescence, for example polyfluorene, polythiophene or polyphenylene or derivatives, compounds, mixtures or copolymers thereof. Depending on the materials in the functional layers, the first radiation generated can have individual wavelengths or ranges or combinations thereof from the ultraviolet to red spectral range.

The second electrode can be embodied as a cathode and therefore serve as electron-injecting material. Inter alia, in particular aluminum, barium, indium, silver, gold, magnesium, calcium or lithium and compounds, combinations and alloys thereof can prove to be advantageous as cathode material. As an alternative or in addition, the second electrode can also comprise one of the TCOs mentioned above.

In addition or as an alternative, the second electrode can also be embodied in transparent fashion and/or the first electrode can be embodied as a cathode and the second electrode as an anode. That means, in particular, that the OLED can also be embodied as a "top emitter".

The first and/or the second electrode can in each case be embodied in large-area fashion. As a result, in the case of an OLED, large-area emission of the electromagnetic radiation generated in the active region can be made possible. In this case, "in large-area fashion" can mean that the electronic component has an area of greater than or equal to a few square millimeters, preferably greater than or equal to one square centimeter, and particularly preferably greater than or equal to one square decimeter. As an alternative or in addition, the first and/or the second electrode can be embodied in structured fashion at least in partial regions. As a result, a structured emission of the electromagnetic radiation generated in the active region can be made possible, for instance in the form of pixels or pictograms.

As an alternative or in addition, the electronic component can be embodied in such a way that the substrate with the at least one functional layer embodied as an organic functional layer comprises or is embodied as a photodetector and/or a transistor.

Furthermore, the electronic component can be produced as an organic electronic component comprising an organic solar cell or photodiode. In this case, the electronic component can have a functional layer which is embodied as an organic functional layer and which has features of the functional layer mentioned in connection with the OLED. Furthermore, the electronic component comprising a solar cell or photodiode can have electrodes having features of the electrodes described above in connection with the OLED.

Furthermore, the electronic component can be embodied as an inorganic electronic component comprising, for example, an LED, PD, SC and/or a TFT. In this case, the at least one functional layer can have or be embodied as an epitaxial layer sequence, that is to say an epitaxially grown semiconductor layer sequence. In particular, the semiconductor layer sequence can comprise, for example, a III-V compound semiconductor on the basis of InGaAlN, InGaAlP and/or AlGaAs and/or a II-VI compound semiconductor comprising one or more of the elements Be, Mg, Ca and Sr and one or more of the elements O, S and Se. By way of example, the II-VI compound semiconductor materials include ZnO, ZnMgO, CdS, ZnCdS and MgBeO. Furthermore, the inorganic electronic component can have electrodes having features of the electrodes described above in connection with the OLED.

The first barrier layer can be applied to the at least one functional layer before the second barrier layer. As a result, a high-density surface uniformly covering the functional layer can be provided by the first barrier layer, the second barrier layer then being applied on said surface. By virtue of the outstanding surface properties of the first barrier layer, the tendency of the second barrier layer to form diffusion channels, grain boundaries and/or pores can be reduced.

In particular, the first barrier layer can be applied directly on the abovementioned second electrode or on the radiation-emitting or radiation-receiving layer sequence. By virtue of application by means of the PEALD method, the first barrier layer can be applied with uniform thickness and complete coverage on the substrate with the at least one functional layer or the functional layer sequence. As a result, no planarization layer is required between the functional layer or the functional layer sequence and the encapsulation.

As an alternative, the second barrier layer can be applied before the first barrier layer is applied. This can be advantageous in particular also because, during the application of the second barrier layer, grain boundaries, channels and/or pores can arise, which can be sealed by the high-density second barrier layer.

The first barrier layer and the second barrier layer can in each case comprise a material suitable for protecting the at least one functional layer against damaging influences of the surroundings, that is to say against oxygen and/or moisture, for instance. By way of example, an oxide, a nitride or an oxynitride in crystalline or vitreous form can be applied as first barrier layer and/or as second barrier layer. By way of example, the oxide, nitride or oxynitride can furthermore comprise aluminum, silicon, tin, zinc, titanium, zirconium, tantalum, niobium or hafnium. In this case, the first and/or the second barrier layer can have dielectric or else electrically conductive properties and comprise, for example, silicon oxide ($SiO_x$) such as, for instance, $SiO_2$, silicon nitride ($Si_xN_y$), such as, for instance, $Si_2N_3$, silicon oxynitride ($SiO_xN_y$), aluminum oxide, for instance $Al_2O_3$, aluminum nitride, tin oxide, indium tin oxide, zinc oxide or aluminum zinc oxide.

In order to produce the first barrier layer, by way of example, an organometallic or an organosemimetallic compound can be fed as first starting compound in the PEALD method described above. An oxygen- and/or nitrogen-containing compound can be fed as second starting compound, in which the plasma is then produced. If the first barrier layer comprises purely by way of example $Al_2O_3$, for instance, then, for instance, trimethylaluminum can be fed as first starting compound and $N_2O$ as second starting compound.

The second barrier layer can furthermore have a layer sequence composed of at least two layers comprising different materials. That can mean that the layer sequence having at least two different layers is applied as second barrier layer. By way of example, the layer sequence can have a layer comprising an oxide and a layer comprising a nitride. The layer sequence can also have a plurality of first layers comprising a first material, for instance a nitride, and/or a plurality of second layers comprising a second material, for instance an oxide, which are applied alternately one on top of another. If the first, nitride-containing layer is designated by "N" and the second, oxide-containing layer is designated by "O", then the layer sequence can be embodied for example in a succession NON or NONON or alternatively ONO or ONONO.

Furthermore, a further first barrier layer and/or a further second barrier layer can be applied on the at least one first barrier layer and/or on the at least one second barrier layer. Thus, for instance, a plurality of first barrier layers and/or a plurality of second barrier layers can be applied on the substrate with the at least one organic functional layer. The first barrier layers and the second barrier layers can preferably be applied alternately one on top of another.

In this case, the further first barrier layer and/or the further second barrier layer can have at least one or a plurality of features described in connection with the at least one first and/or the at least one second barrier layer. In particular, each further first barrier layer can be applied by means of a PEALD method, while each further second barrier layer can be applied by means of a PECVD method.

In accordance with a further embodiment, an electronic component is produced by means of the method described here. The electronic component can have, in particular, a substrate with at least one functional layer and thereabove at least one first barrier layer and at least one second barrier layer. In this case, the at least one first barrier layer and the at least one second barrier layer can each have one or more of the features described above. In this case, the electronic component can be distinguished by a small thickness with at the same time high impermeability of the encapsulation, which component can be produced with high economic viability.

DETAILED DESCRIPTION OF THE DRAWINGS

In the exemplary embodiments and figures, identical or identically acting constituent parts can in each case be provided with the same reference symbols. The elements illustrated and their size relationships among one another should not be regarded as true to scale, in principle; rather, individual elements such as, for example, layers, structural parts, components and regions may be illustrated with exaggerated thickness or size dimensions in order to enable better illustration and in order to afford a better understanding.

The following figures show purely by way of example exemplary embodiments for the production of electronic components and also exemplary embodiments of electronic components which are embodied as organic electronic components comprising an OLED. It should expressly be pointed out that the methods, components and features thereof described hereinafter are also applicable to the other electronic components described in the general part.

Figure 1A:
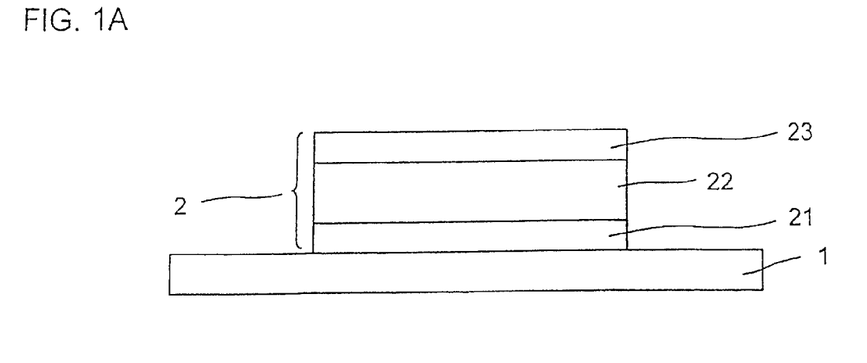
FIGS. 1A to 1C show schematic illustrations of a method in accordance with one exemplary embodiment.
Figure 1B:
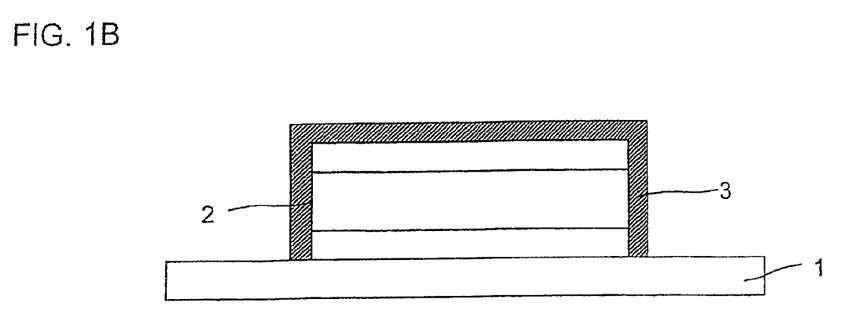
Figure 1C:
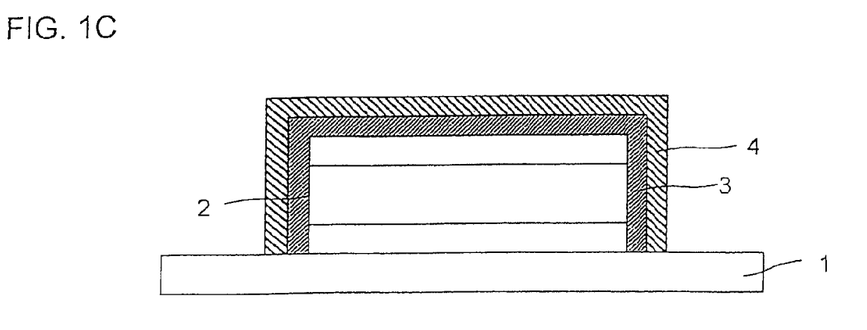

FIGS. 1A to 1C show a method for producing an organic electronic component in accordance with one exemplary embodiment.

In a first method step in accordance with FIG. 1A, a substrate 1 with at least one organic functional layer 22 is provided. In this case, the organic functional layer 22 is part of an organic layer sequence 2 and is embedded between a first electrode 21 and a second electrode 23. In this case, the substrate 1 with the organic layer sequence 2 is embodied as an organic light emitting diode (OLED) and can have further functional layers as described above in the general part (not shown). Electrical contact is made with the first and second electrodes 21, 23 by means of conductor tracks, which are not shown for the sake of clarity.

In the exemplary embodiment shown, the substrate 1 with the organic layer sequence 2 is embodied as a bottom emitter and has a transparent substrate 1 composed of glass and also a transparent first electrode 21 composed of ITO, which is embodied as an anode. The second electrode 23 is reflective and embodied as a cathode and comprises aluminum.

In a further method step in accordance with FIG. 1B, a first barrier layer 3 composed of $Al_2O_3$ is applied on the organic functional layer 22 and in particular on the layer sequence 2 by means of a PEALD method. For this purpose, the substrate 1 with the organic layer sequence 2 is heated in a coating installation to a temperature of less than 100° C., and preferably less than 80° C., and, in a first substep, is exposed to trimethylaluminum as a first starting compound, such that the trimethylaluminum can adsorb on the surface formed by the layer sequence 2 and the substrate 1. In order to avoid adsorption of the first starting compound for example on a contact region of the substrate 1 for subsequently making electrical contact with the organic electronic component, a mask layer covering the contact region can be used, for example, which mask can be removed again after the first barrier layer has been applied. After the non-adsorbed portion of the trimethylaluminum has been removed, in a second substep of the PEALD method, the substrate 1 with the layer stack 2 is exposed to a plasma with $N_2O$ as second starting compound. The $N_2O$ can react with the trimethylaluminum adsorbed on the substrate 1 and the layer sequence 2 to form an $Al_2O_3$ layer having a thickness in the range of from less than 1 nm up to a number of nanometers, which layer, however, is preferably formed as a monolayer. The first and second substeps of the PEALD method are repeated until a 10 to 30 nm thick first barrier layer 3 is produced.

By means of the PEALD method it is possible to produce a high-density first barrier layer 3 which is distinguished by an outstanding crystal structure and has no or merely hardly any pores and/or channels in comparison with a layer grown by means of a CVD method. Furthermore, the first barrier layer 3 produced in this way enables a high-density interface between the barrier layer 3 and, for example, the substrate 1 in the edge region of the encapsulation, as a result of which possible permeation paths for oxygen and/or moisture along said interfaces are avoided.

In a further method step in accordance with FIG. 1C, a second barrier layer 4 composed of $SiO_2$ is applied on the first barrier layer 3 by means of a PECVD method. In this case, the second barrier layer 4 is applied with a thickness of approximately 100 nm to approximately 1000 nm at the same temperature as the first barrier layer 3. On account of the high-density first barrier layer 3, a second barrier layer 4 can be applied with a growth rate that is higher in comparison, in order to attain an intrinsically impermeable encapsulation of the organic layer sequence 2.

Overall, therefore, a high-density encapsulation is attained with short process times in an economic method.

The PEALD method and the PECVD method are carried out in the same coating installation, such that, during the production of the encapsulation with the first barrier layer 3 and the second barrier layer 4, no additional dead times arise as a result of loading and unloading coating installations when changing from the PEALD method to the PECVD method.

As an alternative or in addition to the materials described here, the first and/or the second barrier layer 3, 4 can comprise oxide, nitrides and/or oxynitrides comprising semimetals and/or metals as explained in the general part. As an alternative to the method shown, the second barrier layer 4 can also be applied before the first barrier layer 3 on the substrate and the organic layer stack 2 having the organic functional layer 22.

As an alternative or in addition, the second electrode 23 can be embodied in transparent fashion, such that the organic electronic component can be produced as a top emitter or as a transparent OLED. As an alternative or in addition, the layer sequence 2 can, by way of example, also comprise or be an organic transistor and/or an organic photodiode.

Figure 2:
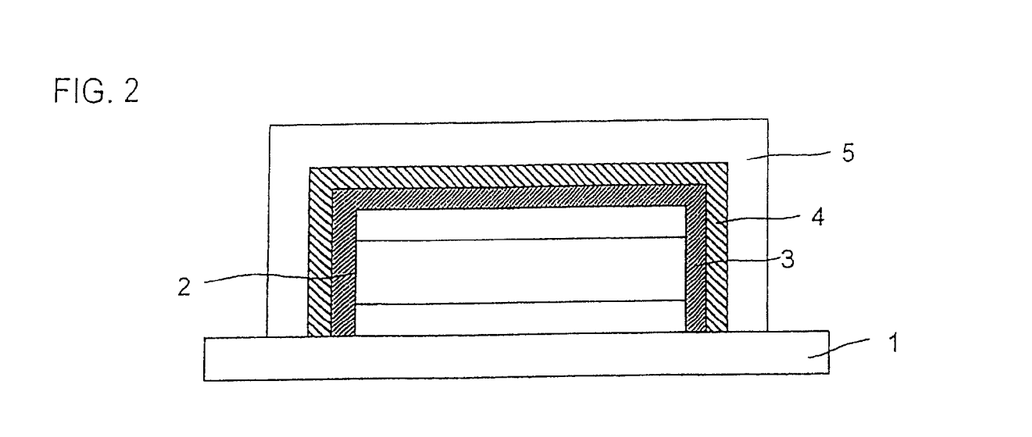
FIG. 2 shows a schematic illustration of an organic electronic component producible by means of a method in accordance with a further exemplary embodiment.

FIG. 2 shows an exemplary embodiment of an organic electronic component produced by means of a method which has a further method step in comparison with the method in accordance with the previous exemplary embodiment.

In this case, after the above-described application of the first and second barrier layers 3, 4, a protective layer 5 is furthermore applied. The protective layer 5 comprises a spray coating, which can be a solvent-containing coating, for example, which is applied with a thickness of 10 to 100 µm in a continuous spray coating installation. By means of the protective layer 5, the organic electronic component and in particular the first and second barrier layers 3, 4 can be effectively protected against scratches and other mechanical damage.

As an alternative or in addition by way of example, a polymer, for instance a silicone resin or epoxy resin, can also be applied as the protective layer 5.

The following figures show excerpts from organic electronic components in accordance with further exemplary embodiments which present modifications and variations of the previous exemplary embodiments. The following description principally relates to the differences with respect to the previous exemplary embodiments.

Figure 3:
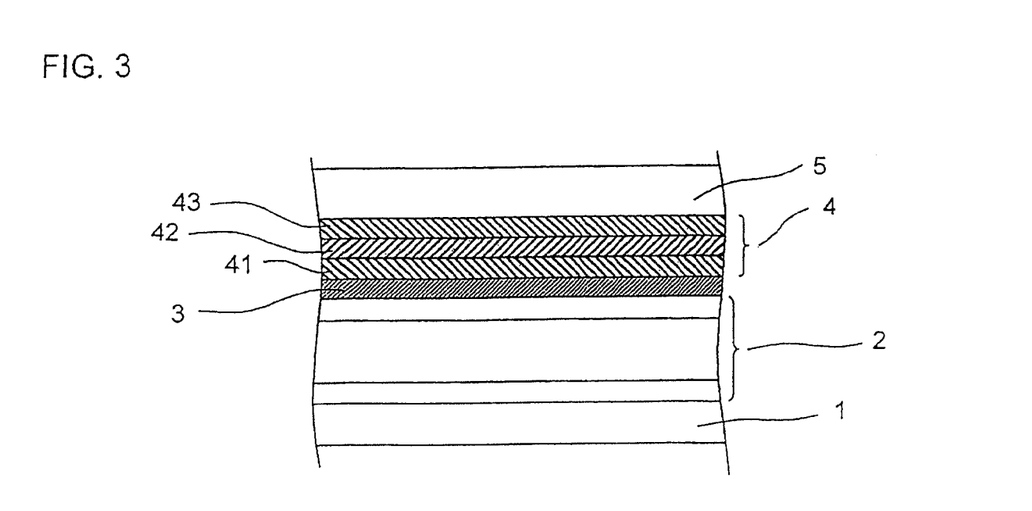
FIGS. 3 to 5 show schematic illustrations of excerpts from electronic components producible by means of methods in accordance with further exemplary embodiments.

FIG. 3 shows an excerpt from an organic electronic component wherein, as in the previous exemplary embodiments, a high-density first barrier layer 3 composed of $Al_2O_3$ is applied above the layer sequence 2. A second barrier layer 4 is applied thereabove by means of a PECVD method, said second barrier layer having three layers 41, 42, 43 having a total thickness of 100 to 100 nm. The layers 41 and 43 are embodied as silicon nitride layer, while the layer 42 is embodied as silicon oxide layer. As an alternative, the materials of the layers 41, 43 and of the layer 42 can also be interchanged. Furthermore, the second barrier layer 4 can also have, by way of example, a layer sequence having five layers that are embodied alternately as silicon oxide and silicon nitride layers.

As an alternative to the exemplary embodiment shown, the first barrier layer 3 can also be applied on the second barrier layer 4 having the layers 41, 42, 43.

Figure 4:
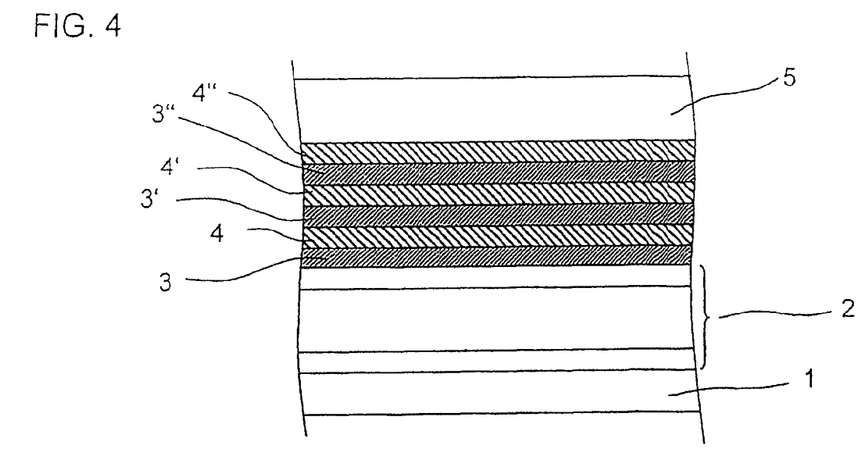
Figure 5:
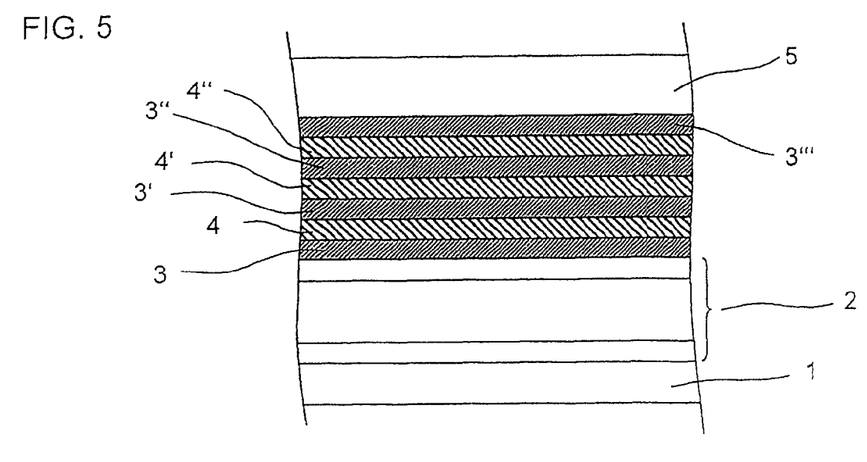

FIGS. 4 and 5 show excerpts from organic electronic components having a plurality of first barrier layers 3, 3', 3" and 3, 3', 3", 3''', respectively and a plurality of second barrier layers 4, 4', 4", which are in each case applied alternately one on top of another by means of PEALD methods and PECVD methods, respectively. Since it is not possible to rule out the situation that the second electrode of the layer sequence 2 and/or the second barrier layers 4, 4', 4" have at least in part defects for example in the form of columnar growth, channels, pores and/or grain boundaries, it is possible, by means of the first barrier layers 3, 3', 3" between the layer sequence 2 and the second barrier layers 4, 4', 4", to ensure that a continuation of such defects can be effectively interrupted. In particular, channels and/or pores that occur in the second barrier layers 4, 4', 4" can be sealed by the overlying first barrier layers 3', 3" and 3'; 3", 3''', respectively.

Furthermore, at least one of the second barrier layers 4, 4' and 4" can have a plurality of layers as shown in conjunction with the exemplary embodiment in FIG. 3.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A method for producing an electronic component comprising barrier layers for the encapsulation of the component, comprising:
   providing a substrate with at least one functional layer;
   applying at least one first barrier layer on the functional layer via plasma enhanced atomic layer deposition (PEALD); and
   applying at least one second barrier layer on the functional layer by means of plasma-enhanced chemical vapor deposition (PECVD);
   wherein the at least one first barrier layer is applied at a temperature of less than 100° C.

2. The method as claimed in claim 1, wherein the at least one first barrier layer is applied at a temperature of less than 80° C.

3. The method as claimed in claim 1, further comprising:
   applying a protective layer on the first and second barrier layers.

4. The method as claimed in claim 3, wherein the protective layer has a spray coating.

5. The method as claimed in claim 1, further comprising:
   applying a first electrode on the substrate and applying a second electrode on the at least one functional layer while providing the substrate with the at least one functional layer;
   wherein the at least one functional layer comprises an organic functional layer and wherein the at least one first barrier layer is applied on the second electrode.

6. The method as claimed in claim 1, wherein at least one of the at least one first barrier layer and the at least one second barrier layer comprises one of an oxide, a nitride and an oxynitride.

7. The method as claimed in claim 1, wherein a layer sequence composed of at least two layers comprising different materials is applied as the second barrier layer.

8. The method as claimed in claim 7, wherein the at least two layers comprising different materials comprise a layer comprising an oxide and a layer comprising a nitride.

9. The method as claimed in claim 7, wherein the first and second barrier layers are applied alternately one on top of another.

10. The method as claimed claim 1, wherein at least one of at least one further first barrier layer and at least one further second barrier layer is applied.

11. The method as claimed in claim 1, wherein the second barrier layer is applied before the first barrier layer.

12. The method as claimed in claim 1, wherein the at least one first barrier layer and the at least one second barrier layer are applied at a temperature of less than 100° C.

13. The method as claimed in claim 1, wherein the at least one first barrier layer has a thickness of greater than or equal to 10 nm and less than or equal to 30 nm.

14. The method as claimed in claim 1, wherein the at least one second barrier layer has a thickness of greater than or equal to 100 nm and less than or equal to 1000 nm.

15. The method as claimed in claim 1, wherein the electronic component comprises at least one of an organic light emitting diode (OLED) and a solar cell.

* * * * *